United States Patent [19]

Barre

[11] Patent Number: 4,622,621
[45] Date of Patent: Nov. 11, 1986

[54] CHIP CARRIER FOR HIGH FREQUENCY POWER COMPONENTS COOLED BY WATER CIRCULATION

[75] Inventor: Lucien Barre, Tours, France

[73] Assignee: Thomson-CSF, Paris, France

[21] Appl. No.: 807,019

[22] Filed: Dec. 9, 1985

[30] Foreign Application Priority Data

Dec. 11, 1984 [FR] France .................... 84 18927

[51] Int. Cl.[4] .............................................. H05K 7/20
[52] U.S. Cl. .................................... 361/382; 165/80.3;
361/385; 361/401; 361/403
[58] Field of Search .................... 357/72, 81, 82;
174/16 HS, 15 R, 16 R, 52 FP, 52 PE; 339/112
R, 112 L; 165/80.3, 80.4, 185, 104.33;
361/382–389, 400, 401, 403, 405

[56] References Cited

U.S. PATENT DOCUMENTS

| 3,741,292 | 6/1973 | Aakalv | 165/104.33 |
| 4,079,410 | 3/1978 | Schierz . | |
| 4,216,488 | 8/1980 | Hutson | 357/37 |
| 4,341,432 | 7/1982 | Cutchaw . | |
| 4,504,886 | 3/1985 | Cygan . | |
| 4,577,402 | 3/1986 | Swanstrom | 361/386 |

FOREIGN PATENT DOCUMENTS 2316737 1/1977 France .

*Primary Examiner*—G. P. Tolin
*Attorney, Agent, or Firm*—Oblon, Fisher, Spivak, McClelland & Maier

[57] ABSTRACT

A chip carrier is provided for power components operating at high frequency, comprising a main heat conducting body with a cavity in which said component is housed, and forced flow fluid ducts. The chip carrier is inserted in a window cut out in a printed circuit board. A projecting flange bears against the edge of the window, whereas flat electrodes, extending from the carrier in the same plane as the flange, bear against connections printed on the board. Below the board, the cooling fluid forced flow channels are connected to delivery and discharge ducts.

1 Claim, 6 Drawing Figures

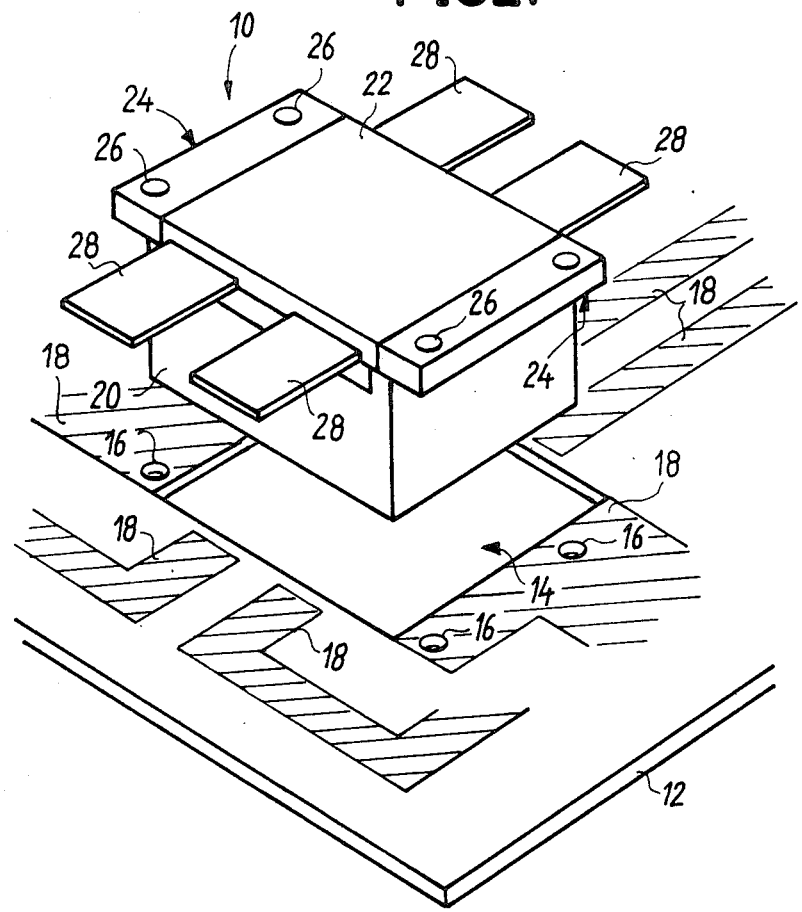
FIG_1
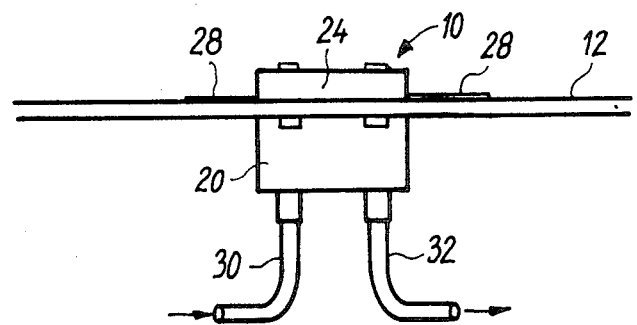
FIG_2

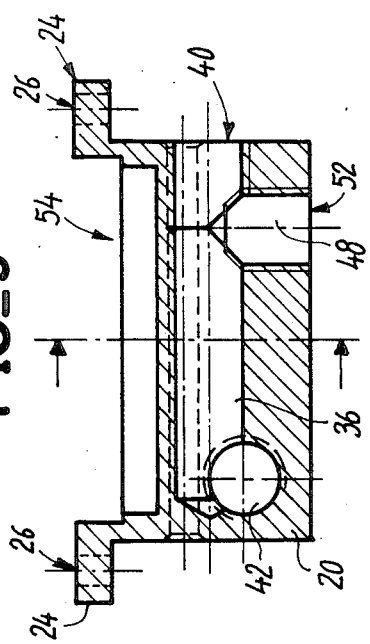
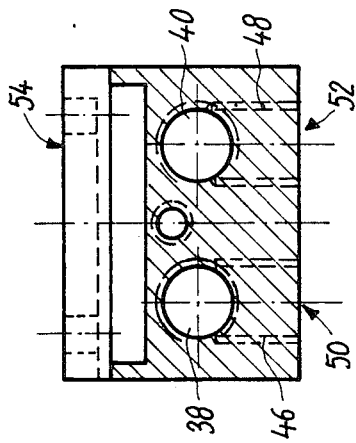
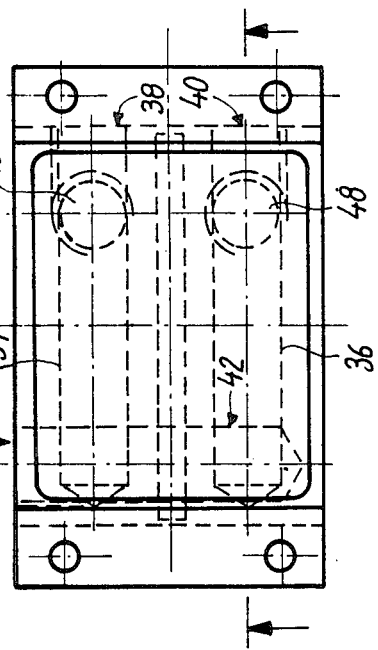
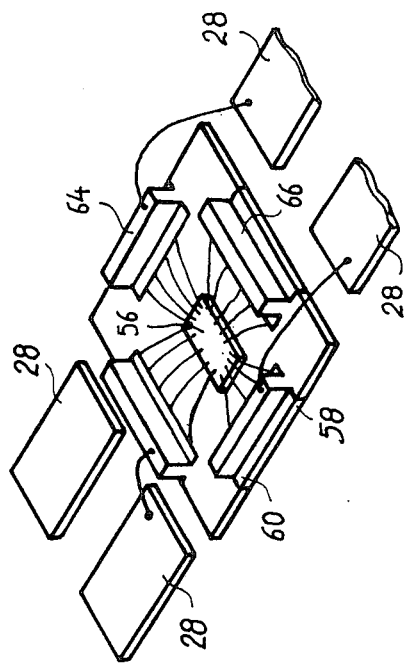

CHIP CARRIER FOR HIGH FREQUENCY POWER COMPONENTS COOLED BY WATER CIRCULATION

BACKGROUND OF THE INVENTION

The invention relates to power component chip carriers or cases called on to operate at high frequencies.

Existing chip carriers are not well adapted to the dissipation of high powers (of the order of 1 kilowatt), more particularly because of the difficulty in finding compromises between correct cooling of the components and reduction of the size of the chip carrier and its cooling system. It is in fact known that for circuits operating at high frequencies the dimensions of the connections are critical for they introduce parasite capacities and inductances, and it is necessary to limit them as much as possible. The heat dissipation carrier of a component placed on a printed circuit has dimensions which react on the length and position of the connections between this component and the other elements of the printed circuit. Furthermore, the high frequency involves further precautions which are not always compatible with the preceding requirements. Finally, the couplings of connections must be brought as much as possible into the same plane, these devices being systematically mounted on printed circuits.

SUMMARY OF THE INVENTION

The present invention provides a new chip carrier structure providing a very good compromise as defined above. This structure is adapted to the encapsulation of a single component or of several components in the same carrier.

The chip carrier comprises a main heat conducting body, having a cavity for housing at least one component, as well as recesses formed in the main body and access openings to these recesses for introducing and removing a cooling fluid under forced circulation; over a part of its periphery, the main body is provided with a projecting flange having a lower flat surface forming a bearing surface when the body of the chip carrier is inserted in a window cut out in a printed circuit board; over another part of the periphery of the main body, flat electrodes extend from the cavity, in which they are connected to the component, these electrodes having their lower face situated in the plane of said bearing surface so that when the body of the chip carrier is inserted in said window the electrodes come to bear against connections printed on the board, which connections extend substantially to the edge of the window formed in the board; finally, the access openings to the recesses are placed below the plane of the bearing surface and at a sufficient distance from this plane for it to be possible, when the body of the chip carrier is placed in the window of the board, to connect to these openings fluid delivery and discharge ducts which are consequently situated below the printed circuit board, i.e. on the side thereof opposite the side which supports the flat electrodes in contact with the connections of the printed circuit.

Preferably, the openings are situated in a face of the main body parallel or perpendicular to the flat bearing surface and the ducts which are connected thereto extend perpendicularly to this face.

BRIEF DESCRIPTION OF THE DRAWINGS

Other features and advantages of the invention will be clear from reading the following detailed description with reference to the accompanying drawings in which:

FIG. 1 is a perspective view of the chip carrier placed above a window cut out in a printed circuit board;

FIG. 2 shows, in a side view, the chip carrier placed in this window and connected to cooling fluid circulation ducts;

FIGS. 3 to 5 show the main body of the chip carrier, respectively in cross section, in longitudinal section and in a top view; and FIG. 6 shows the elements positioned in the cavity of the main body of the chip carrier.

DESCRIPTION OF THE PREFERRED EMBODIMENTS

In FIG. 1 is shown a perspective view of the chip carrier 10 of the invention placed above a printed circuit board 12 on which this chip carrier is to be mounted.

In the example, shown, the chip carrier has a general parallelepipedic shape and it is intended to be inserted in a rectangular window 14 cut out in the printed circuit board 12. It is also intended to be fixed to this board by bolts or rivets passing through circular openings 16 formed in the vicinity of window 14.

Printed connections 18 reach the vicinity of window 14 and it is to these connections that the power component (or the power components) enclosed in the carrier 10 is to be connected electrically. In FIG. 1 four printed connections have been shown, by way of example. These connections allow the component or components to be connected to other elements of the printed circuit.

In what follows and in the claims, by top or upper surface of the printed circuit board is meant the side (visible in FIG. 1) which carries these connections, and bottom or lower surface the opposite side, not visible in FIG. 1.

Similarly, by top or upper surface of other elements is meant the sides or surfaces parallel to the surfaces of the board and visible in the direction of observation of the chip carrier in FIG. 1, opposed to the bottom or lower surface of these elements, not visible in the perspective direction of observation of FIG. 1.

The chip carrier 10 comprises a main body 20 made from a heat conducting material (copper for example) for, besides its role of protecting the component which it contains, it plays the role of dissipator of the heat generated in the component. The main body comprises a cavity in which the component or components is housed. This cavity is not visible in the external view of FIG. 1, but a cover 22 can be seen which closes it in the example shown. It is for example an electrically insulating protective resin cover injected into the cavity for burying the component.

The lower part of the main body 20 has dimensions corresponding substantially to those of the window 14 for insertion in this window. This lower part is here rectangular. The upper part further comprises, over a part of its periphery, a projecting flange 24 (here a flange on one side of the rectangle and another flange on an opposite side of the rectangle). The projecting flange 24 has a lower flat face defining a bearing surface, which comes to bear on the edges of window 14 cut out in the printed circuit board 12 when the main body 20 is inserted into this window.

Flange 24 is pierced with circular openings 26 of dimensions and positions adapted to those of the openings 16 in the printed circuit board, for firmly fixing the chip carrier against the board. When the chip carrier is inserted and fixed, the major part of the height of the main body 20 is situated below the printed circuit board 22.

From the closed cavity containing the component extend flat metal electrodes, here four electrodes 28. These electrodes extend from a part of the main body 20 not provided with a projecting flange 24. They are coplanar and the plane of their lower surface coincides with the plane of the bearing surface formed by the lower face of the projecting flange 24. The lateral positions of the different electrodes 28 correspond to the positions of the printed connections 18 of board 12; when the chip carrier is fixed to the board, the projecting flanges are intimately applied against the edges of window 14 and the flat electrodes 28 are intimately applied each against a respective connection 18, ensuring an efficient electrical connection in the same plane of two flat conductors.

The main body 20 of the chip carrier comprises internal recesses not visible in FIG. 1, for the flow of a cooling fluid under forced circulation. These recesses open to the outside of body 20 through apertures (as a rule a fluid delivery aperture and a discharge aperture) which may be connected to fluid circulation ducts.

The apertures are placed below the plane of the bearing surface of flanges 24 and so below the plane of the lower face of electrodes 28 at a sufficient distance from this plane so that, when the chip carrier is in position on the board 12, the apertures and the ducts which are connected thereto are situated below the board 12 (whereas the electrodes are above).

FIG. 2 shows a side view of the chip carrier 10 mounted on the board, with the electrodes 28 which rest on the board and forced circulation ducts 30 (incoming) and 32 (outgoing) connected respectively to a fluid delivery aperture and to a fluid discharge aperture which in this case are turned downwards; instead of being formed in the lower face of the chip carrier (face parallel to the plane of the electrodes), these apertures could be formed in the side faces, but fairly far from the plane of the lower surface of board 12 so that the ducts may be readily positioned below the board.

FIGS. 3 to 5 show, respectively in cross section, in longitudinal section and in a top view, the main body of the chip carrier; the component, and the resin which buries the component and closes the cavity in which the component is housed, have not been shown in these figures, nor have the external connection electrodes.

It can be clearly seen in these Figures that several channels or recesses are formed in the main body 20, with access apertures to these channels opening outside the main body. The recesses are here formed by horizontal (longitudinal and transverse) bores and vertical bores. These bores intersect mutually and so form communication paths for causing a cooling fluid to flow between two external apertures.

More precisely, two parallel horizontal channels 34 and 36 can be seen here pierced in a direction which will be called longitudinal, opening through two respective outer apertures 38 and 40. The section of FIG. 3 is made through channel 36. A horizontal channel 42 pierced in transverse direction causes the longitudinal channels 34 and 36 to communicate together at their end opposite the apertures 38 and 40. This channel 42 opens through an aperture 44. Two vertical channels 46 and 48 may in addition be pierced from the lower surface of the main body towards the longitudinal channels 34 and 36 to their ends on the same side as openings 38 and 40. These channels 46 and 48 open in the lower face of body 20 through apertures 50 and 52 respectively.

Apertures 38 and 40 as well as the apertures (50 and 52) are situated substantially below the plane of the bearing surface (lower face) of the projecting flanges 24. The apertures of the different channels are threaded so as to be able to fix therein either a plug (more especially in aperture 44), or a connection for a force flow fluid delivery or discharge duct.

For example, apertures 38 and 40 are plugged and apertures 50 and 52 are connected to ducts; the opposite is also possible, namely apertures 50 and 52 can be plugged and ducts connected to apertures 38 and 40.

To finish the description of FIGS. 3 to 5, it can be seen that the upper part of the main body 20, not pierced with channels, comprises a large upwardly open cavity 54 for receiving several elements which are:

the power component or components, the ends of electrodes 28 to which these components are connected, an insulating plate for insulating the electrodes of the body of the chip carrier or possibly a small printed circuit (conducting tracks printed on an insulating support) on which the components are placed and against which the electrodes are applied, finally an insulating protective resin which will fill the cavity after the different preceding elements have been placed in position.

The elements to be placed inside the cavity are shown in FIG. 6 in the case of a single component with four connections (four front face electrodes of the chip forming the component and a rear face electrode).

The chip is designated by the reference 56. It is generally soldered by its rear face to a printed conducting track of an insulating plate 58. The chip is connected electrically to studs 60, 62, 64, 66 which are themselves connected by wires soldered to conducting electrodes 28 cut out from a metal plate.

When plate 58 is placed in cavity 54 then the electrodes, the front part of the electrodes projects outside the chip carrier on the sides which are not surrounded by the projecting flange 24. To facilitate positioning of the electrodes, they may be secured to a peripheral holding frame not shown, which will be cut for isolating the electrodes from each other at the end of assembly (frame of dimensions greater than those of the carrier).

The electrodes are positioned and the connecting wires are soldered, after which a protective resin is then provided for closing the cavity 54.

It should be noted that other electrically insulating plates may be provided, preferably heat conducting (aluminium), between the bottom of cavity 54 and the printed support plate 58.

The total thickness of the elements installed in cavity 54 must be such that the lower surface of the electrodes is flush with the plane of the lower surface of the projecting flange 24.

What is claimed is:

1. In a chip carrier for power electronic components, comprising a heat conducting main body having a cavity for housing at least one component, as well as recesses formed in the main body and apertures for access to these recesses for introducing and discharging a forced flow cooling fluid, over a part of its periphery, said main body is provided with a projecting flange having a lower flat surface forming a bearing surface on which the body of the chip carrier is inserted in a window cut out in a printed circuit board;

over another part of the periphery of the main body, flat electrodes extend from the cavity, in which they are connected to the component, these electrodes having their lower face situated in the plane of said bearing face so that when the body of the chip carrier is inserted in said window the electrodes come to bear against connections printed on the board, which connections extend substantially to the edge of the window;

apertures for access to said recesses are placed below the plane of the bearing surface and at a sufficient distance from this plane for it to be possible, when the body of the chip carrier is placed in the window of the board, to connect to these apertures fluid delivery and discharge ducts which are consequently situated on the other side of the supporting board with respect to the flat electrodes.

* * * * *